(12) United States Patent
Feng

(10) Patent No.: US 11,378,525 B2
(45) Date of Patent: Jul. 5, 2022

(54) SYSTEMS AND METHODS FOR EVALUATING CRITICAL DIMENSIONS BASED ON DIFFRACTION-BASED OVERLAY METROLOGY

(71) Applicant: YANGTZE MEMORY TECHNOLOGIES CO., LTD., Wuhan (CN)

(72) Inventor: Yaobin Feng, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 17/180,713

(22) Filed: Feb. 19, 2021

(65) Prior Publication Data

US 2021/0172881 A1    Jun. 10, 2021

Related U.S. Application Data

(60) Division of application No. 16/727,863, filed on Dec. 26, 2019, now Pat. No. 11,162,907, which is a
(Continued)

(51) Int. Cl.
*G01N 21/95* (2006.01)
*G01N 21/88* (2006.01)
(Continued)

(52) U.S. Cl.
CPC ..... *G01N 21/9501* (2013.01); *G01N 21/8806* (2013.01); *G01N 21/95607* (2013.01); *H01L 22/12* (2013.01)

(58) Field of Classification Search
CPC ..................................... H01L 22/12
See application file for complete search history.

(56) References Cited

U.S. PATENT DOCUMENTS

| 6,855,464 | B2 | 2/2005 | Niu et al. |
| 7,561,282 | B1 | 7/2009 | Widmann |

(Continued)

FOREIGN PATENT DOCUMENTS

| CN | 101174581 A | 5/2008 |
| CN | 104520982 A | 4/2015 |

(Continued)

OTHER PUBLICATIONS

International Search Report issued in corresponding International Application No. PCT/CN2019/111943 dated Jul. 3, 2020, 5 pages.

*Primary Examiner* — Michael A Lyons
(74) *Attorney, Agent, or Firm* — Bayes PLLC

(57) ABSTRACT

Systems and methods for evaluating critical dimensions of a semiconductor device are provided. The semiconductor device includes a first layer comprising a first set of overlay markings and a second layer comprising a second set of overlay markings. The second layer is higher than the first layer. The first set of overlay markings includes a plurality of diffraction gratings. Each of the plurality of diffraction gratings has a first period. The second set of overlay markings includes a plurality diffraction grating clusters. Each of the plurality of diffraction grating clusters has a plurality of diffraction grating units. The plurality of diffraction grating units in at least one of the plurality of diffraction grating clusters have the first period. At least one of the plurality of diffraction grating units includes a diffraction grating having a second period that is smaller than the first period.

13 Claims, 7 Drawing Sheets

Related U.S. Application Data continuation of application No. PCT/CN2019/111943, filed on Oct. 18, 2019.

(51) Int. Cl.
*G01N 21/956* (2006.01)
*H01L 21/66* (2006.01)

(56) References Cited

U.S. PATENT DOCUMENTS

| | | |
|---|---|---|
| 9,739,702 B2 | 8/2017 | Bringoltz et al. |
| 10,508,906 B2 | 12/2019 | Den Boef et al. |
| 2005/0158636 A1 | 7/2005 | Park et al. |
| 2015/0177135 A1* | 6/2015 | Amit .................. G03F 7/70683 702/150 |
| 2017/0184977 A1 | 6/2017 | Jak et al. |
| 2017/0307983 A1 | 10/2017 | Den Boef et al. |
| 2017/0330808 A1* | 11/2017 | Heider ................ H01L 29/2003 |
| 2019/0094703 A1 | 3/2019 | Jak et al. |

FOREIGN PATENT DOCUMENTS

| | | |
|---|---|---|
| CN | 107924852 A | 4/2018 |
| CN | 108695184 A | 10/2018 |
| CN | 109427749 A | 3/2019 |
| CN | 109478023 A | 3/2019 |
| TW | I583917 B | 5/2017 |
| TW | I618988 B | 3/2018 |
| TW | I634325 B | 9/2018 |
| WO | 2005/069082 A1 | 7/2005 |
| WO | 2017108411 A1 | 6/2017 |

\* cited by examiner

SYSTEMS AND METHODS FOR EVALUATING CRITICAL DIMENSIONS BASED ON DIFFRACTION-BASED OVERLAY METROLOGY

CROSS-REFERENCE TO RELATED APPLICATIONS

This application is division of U.S. application Ser. No. 16/727,863, filed on Dec. 26, 2019, entitled "SYSTEMS AND METHODS FOR EVALUATING CRITICAL DIMENSIONS BASED ON DIFFRACTION-BASED OVERLAY METROLOGY," which is continuation of International Application No. PCT/CN2019/111943, filed on Oct. 18, 2019, entitled "SYSTEMS AND METHODS FOR EVALUATING CRITICAL DIMENSIONS BASED ON DIFFRACTION-BASED OVERLAY METROLOGY," both of which are hereby incorporated by reference in their entireties.

BACKGROUND

Embodiments of the present disclosure relate to quality control of semiconductor devices during the fabrication process, and more particularly, to evaluation of critical dimensions (CDs) of the semiconductor devices using diffraction-based overlay (DBO) metrology.

Conventional methods for monitoring and measuring critical dimensions of features on a semiconductor wafer include critical dimension scanning electron microscopy (CDSEM) and optical critical dimension (OCD) metrology. CDSEM uses electron beams to image the structure on the wafer surface with very high amplification, thereby achieving measurement of critical dimensions. OCD analyzes optical signals diffracted from periodic structures on the wafer to examine the quality of the fabrication process. Both methods require specific and expensive equipment to implement the function of evaluating critical dimensions.

The present disclosure provides systems and methods for evaluating critical dimensions using improved DBO technique with reduced cost.

SUMMARY

In one example, a system is provided for evaluating critical dimensions of a semiconductor device. The system includes at least one processor and at least one memory. The at least one memory stores instructions that, when executed by the at least one processor, cause the at least one processor to perform operations. The operations include receiving information of a first set of overlay markings on a first layer of the semiconductor device and information of a second set of overlay markings on a second layer of the semiconductor device. The first layer is lower than the second layer. The operations also include receiving a plurality of diffraction parameters measured from corresponding overlay markings on the first and second layers. The operations further include determining a variation of the critical dimensions on the second layer based on the plurality of diffraction parameters.

In another example, a method is provided for evaluating critical dimensions of a semiconductor device. The method includes providing a first set of overlay markings on a first layer of the semiconductor device and a second set of overlay markings on a second layer of the semiconductor device. The first layer is lower than the second layer. The method also includes obtaining a plurality of diffraction parameters measured from corresponding overlay markings on the first and second layers. The method further includes determining a variation of the critical dimensions on the second layer based on the plurality of diffraction parameters.

In a further example, a semiconductor device is provided. The semiconductor device includes a first layer comprising a first set of overlay markings and a second layer comprising a second set of overlay markings. The second layer is higher than the first layer. The first set of overlay markings includes a plurality of diffraction gratings. Each of the plurality of diffraction gratings has a first period. The second set of overlay markings includes a plurality diffraction grating clusters. Each of the plurality of diffraction grating clusters has a plurality of diffraction grating units. The plurality of diffraction grating units in at least one of the plurality of diffraction grating clusters have the first period. At least one of the plurality of diffraction grating units includes a diffraction grating having a second period that is smaller than the first period.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
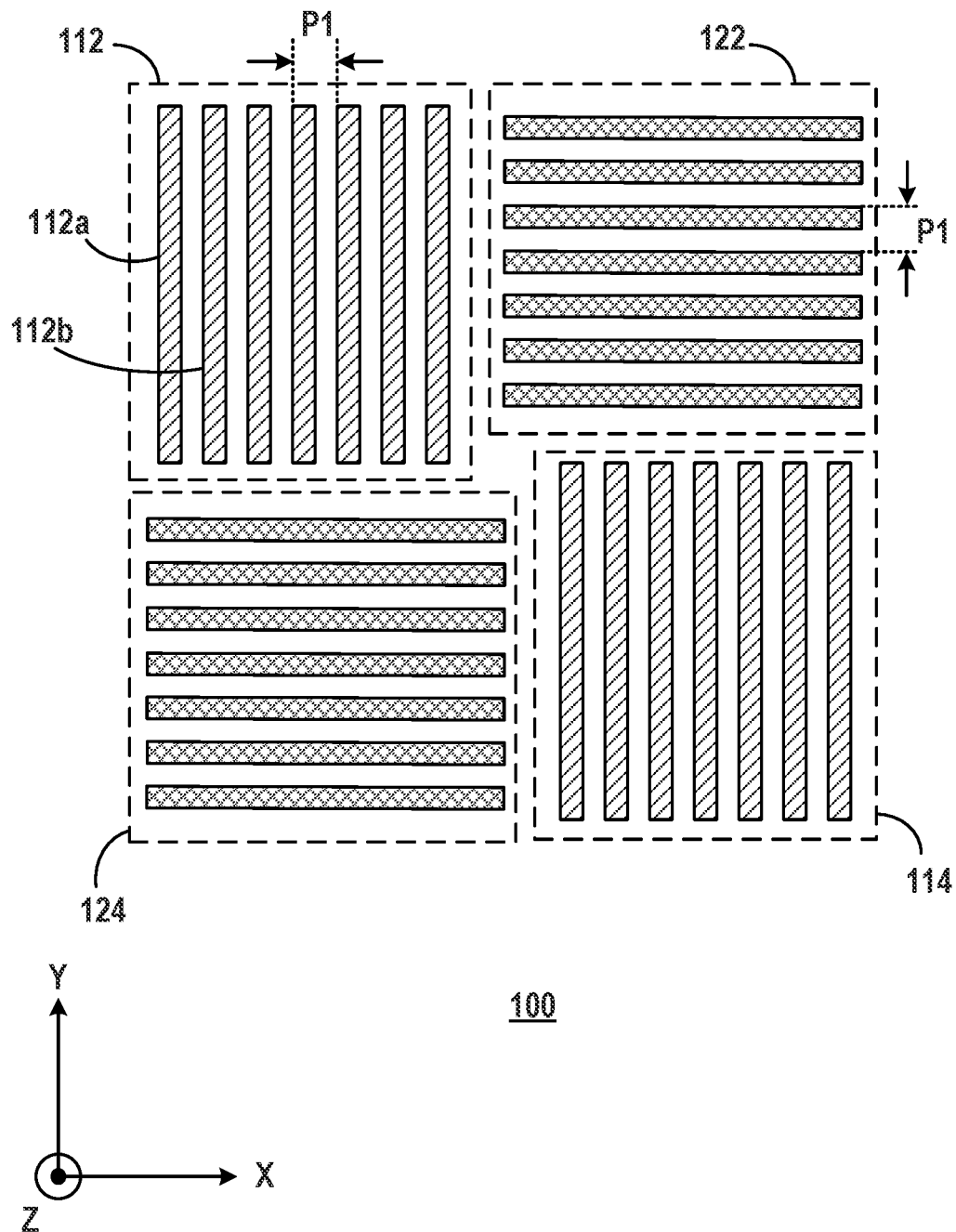
FIG. 1 illustrates an exemplary set of overlay markings on a reference layer of a semiconductor device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

In semiconductor device fabrication, a critical dimension (CD) refers to the size (e.g., width) of a feature measured at a specific height (e.g., in a particular layer) above the substrate. Monitoring and evaluating the CDs of a semiconductor device plays an important role in quality control and assurance. As discussed above, conventional CD evaluation methods such as CDSEM and OCD require specific and expensive equipment. It is advantageous to achieve similar function of evaluating CDs using alternative methods to reduce cost.

Diffraction-based overlay (DBO) metrology is conventionally used for measuring the alignment of features on two layers at different heights above the substrate by analyzing the intensity difference between two diffracted light signals. Based on the intensity difference, an offset between corresponding features on the two layers can be determined. Currently DBO systems can be used to collect overlay offset data, but they are incapable of evaluating distribution of CDs on a specific layer. Embodiments of the present disclosure expand the functionality of DBO systems such that they can be configured to determine variations of the CDs on a particular layer of a semiconductor device.

In some embodiments, to evaluate CDs of a semiconductor device using DBO metrology, overlay markings are provided on at least two different layers of the semiconductor device: a first set of overlay markings are provided on a first layer (also referred to as a reference layer) and a second set of overlay markings are provided on a second layer (also referred to as a target layer). The reference layer is lower (e.g., closer to the substrate along the vertical direction) than the target layer. FIG. 1 illustrates an exemplary set of overlay markings 100 on a reference layer of a semiconductor device, according to some embodiments of the present disclosure. FIG. 1 is a top view of a lateral plane X-Y at a particular height $z1$ above the substrate of the semiconductor device, where the Z direction is a vertical direction perpendicular to the plane of the substrate. Referring to FIG. 1, overlay marking set 100 includes a plurality of diffraction gratings (also referred to as gratings for simplicity), e.g., 112, 114, 122, and 124. Each of the plurality of gratings has a periodic structure (e.g., formed by 112a, 112b, etc.) with a period P1. The periodic structure may include a positive grating structure, e.g., a plurality of ridges, or a negative grating structure, e.g., a plurality of grooves. While FIG. 1 shows an example in which the periodic structure has 7 ridges or grooves (also collectively referred to as overlay markings), the number of the overlay markings in a periodic structure may vary. For example, some embodiments may include 4, 5, 6, 8, 9, 10, or other numbers of overlay markings in a periodic structure. In some embodiment, P1 may be in a range between 500 nanometers to 10 micrometers, such as 500 nanometers, 800 nanometers, 1 micrometer, 2 micrometers, 5 micrometers, 10 micrometers, or within any subranges defined by these values. The plurality of gratings include at least two groups: the first group of gratings, including 112 and 114, are oriented along the Y direction, while the second group of gratings, including 122 and 124, are oriented along the X direction that is perpendicular to the orientation of the first group (Y direction). In some embodiments, the first and second groups of diffraction gratings may be oriented in directions other than the X and Y directions, so long as the two orientations are perpendicular to each other. As shown in FIG. 1, at least two gratings in the first group, e.g., 112 and 114, are diagonally disposed with respect to each other. In other words, gratings 112 and 114 are arranged in the second and fourth quadrants, respectively, when the X-Y plane shown in FIG. 1 is represented by a Cartesian coordinate system. Similarly, gratings 122 and 124 are diagonally disposed with respect to each other, arranged in the first and third quadrants, respectively.

Figure 2:
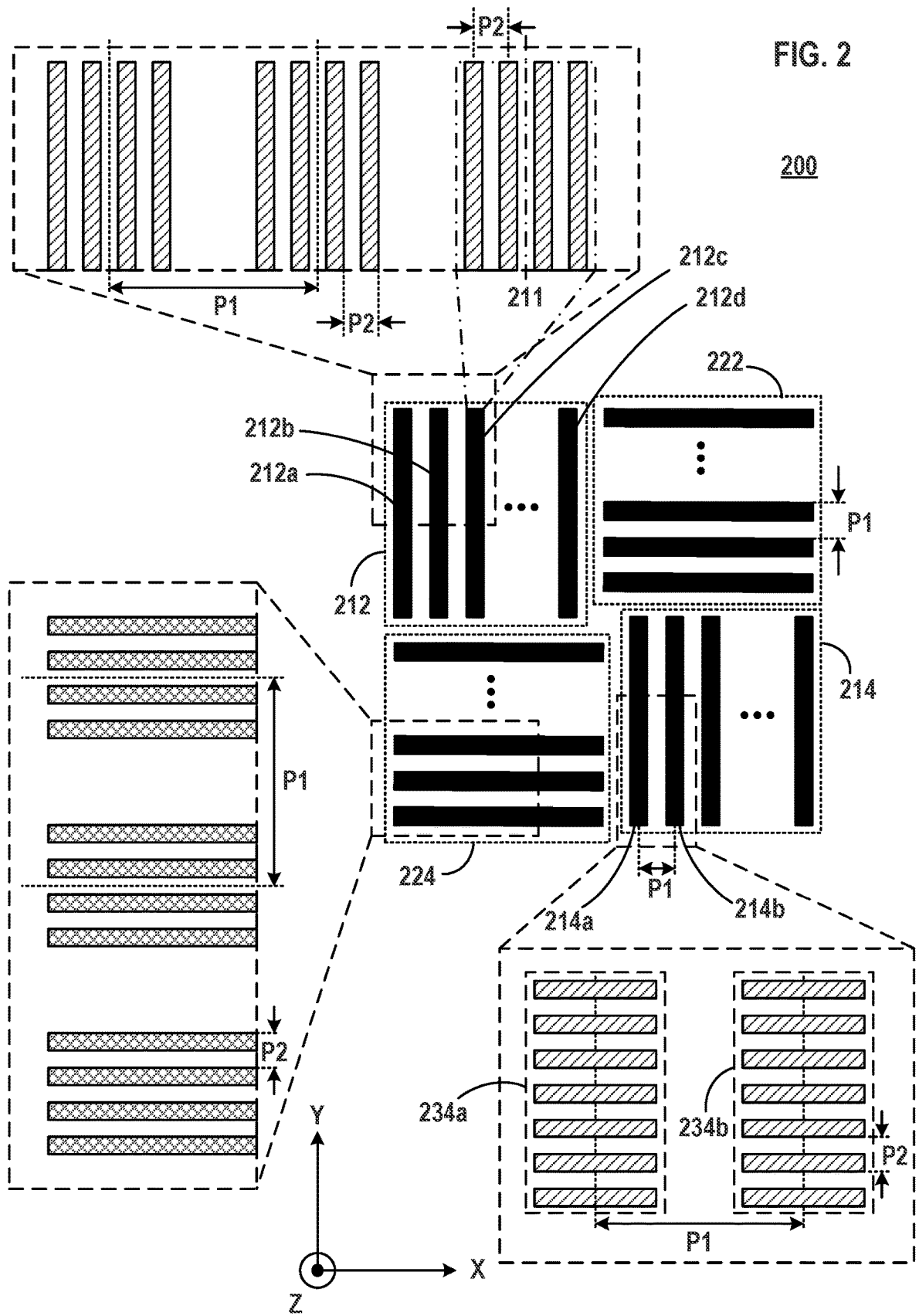
FIG. 2 illustrates an exemplary set of overlay markings on a target layer of a semiconductor device, according to some embodiments of the present disclosure.

FIG. 2 illustrates an exemplary set of overlay markings 200 on a target layer of the semiconductor device of FIG. 1, according to some embodiments of the present disclosure. Similar to FIG. 1, FIG. 2 also shows a top view of a lateral plane X-Y, this time at another height $z2$ above the substrate. In some embodiments, $z2>z1$, meaning that the lateral plane shown in FIG. 2 is higher (further away from the substrate) than the lateral plane shown in FIG. 1. In other words, the target layer shown in FIG. 2 is above the reference layer shown in FIG. 1. As shown in FIG. 2, overlay marking set 200 on the target layer includes a plurality of diffraction grating clusters (also referred to as grating clusters for simplicity), e.g., 212, 214, 222, and 224, that respectively overlay the plurality of gratings, e.g., 112, 114, 122, and 124, on the reference layer. Each of the plurality of grating clusters includes a plurality of diffraction grating units (also referred to as grating units for simplicity), shown in FIG. 2 as solid black blocks. For example, grating cluster 212 includes multiple grating units 212a, 212b, 212c, . . . , 212d, as shown in FIG. 2. The grating units in each grating cluster are generally aligned (e.g., generally aligned but with controllable offsets) with the corresponding grating structures (e.g., ridges or grooves) in the reference layer. The plurality of grating units (e.g., 212a-212d) in a grating cluster (e.g., 212) are arranged in a periodic structure having the same period of P1 as that of the corresponding gratings (e.g., 112) on the reference layer.

Each grating unit in a grating cluster includes a finer diffraction grating (e.g., compared to the gratings on the reference layer) that has a second period P2, which is smaller than P1. For example, FIG. 2 shows a zoomed view of a portion of grating cluster 212, revealing the actual structure of each grating unit 212a, 212b, and 212c. As shown in FIG. 2, each grating unit 212a, 212b, and 212c includes a grating having a plurality of linear structures oriented along the Y direction and arranged in a periodic manner Within each grating unit, the linear structures are arranged according to period P2. In FIG. 2, the linear structures having period P2 form the actual overlay markings. Among multiple grating units, the group of linear structures (e.g., one group per grating unit) are also arranged periodically according to period P1.

In some embodiment, period P2 may be substantially the same as a structural period of an anchor pattern on the target layer, including the structural period of the features, patterns, or other functional components that are arranged in a periodic manner on the target layer. In some embodiments, period P2 may be in a range between 1 nanometer to 500 nanometers, such as 1 nanometer, 5 nanometers, 10 nanometer, 50 nanometers, 100 nanometers, 250 nanometers, 500 nanometers, or within any subranges defined by these values. The gratings having the period of P2 may have linear structures (e.g., linear ridges or grooves), as shown in FIG. 2. In other embodiments, the gratings having the period of P2 may have non-linear structures (e.g., holes or protrusions arranged in a periodic manner).

In some embodiments, a grating having the period of P2 is symmetrically arranged with respect to a geometrical center of the corresponding grating unit that includes the grating. For example, FIG. 2 shows a zoomed view of grating unit 212c, which includes a grating having four linear structures arranged in a periodic manner having a period P2. The geometric center of grating unit 212c can be defined as the center line 211, which is equally distanced from both edges of grating unit 212c. As shown in FIG. 2, the four linear structures are symmetrically arranged with respect to center line 211. Although four linear structures are shown within grating unit 212c in FIG. 2, a different number of linear structures may be used, depending on factors such as diffraction parameters, critical dimensions, etc.

FIG. 2 also shows another zoomed view of a portion of grating cluster 224, revealing finer gratings oriented along the X direction and arranged periodically according to two periods: the smaller period P2 for the linear structures within each grating unit, and the larger period P1 for the groups of linear structures (e.g., one group per grating unit).

The zoomed views of the portions of grating clusters 212 and 224 show that the gratings having the finer period (e.g., P2) have the same orientation as their corresponding grating units. For example, the linear structures corresponding to grating unit 212c and grating unit 212c are both oriented along the Y direction. In some embodiments, gratings having the finer period (e.g., P2) may have a different orientation than their corresponding grating units. For example, FIG. 2 shows that gratings 234a and 234b respectively corresponding to grating units 214a and 214b in grating cluster 214 are oriented along the X direction, perpendicular to the orientation of grating units 214a and 214b, which are oriented along the Y direction.

Figure 3:
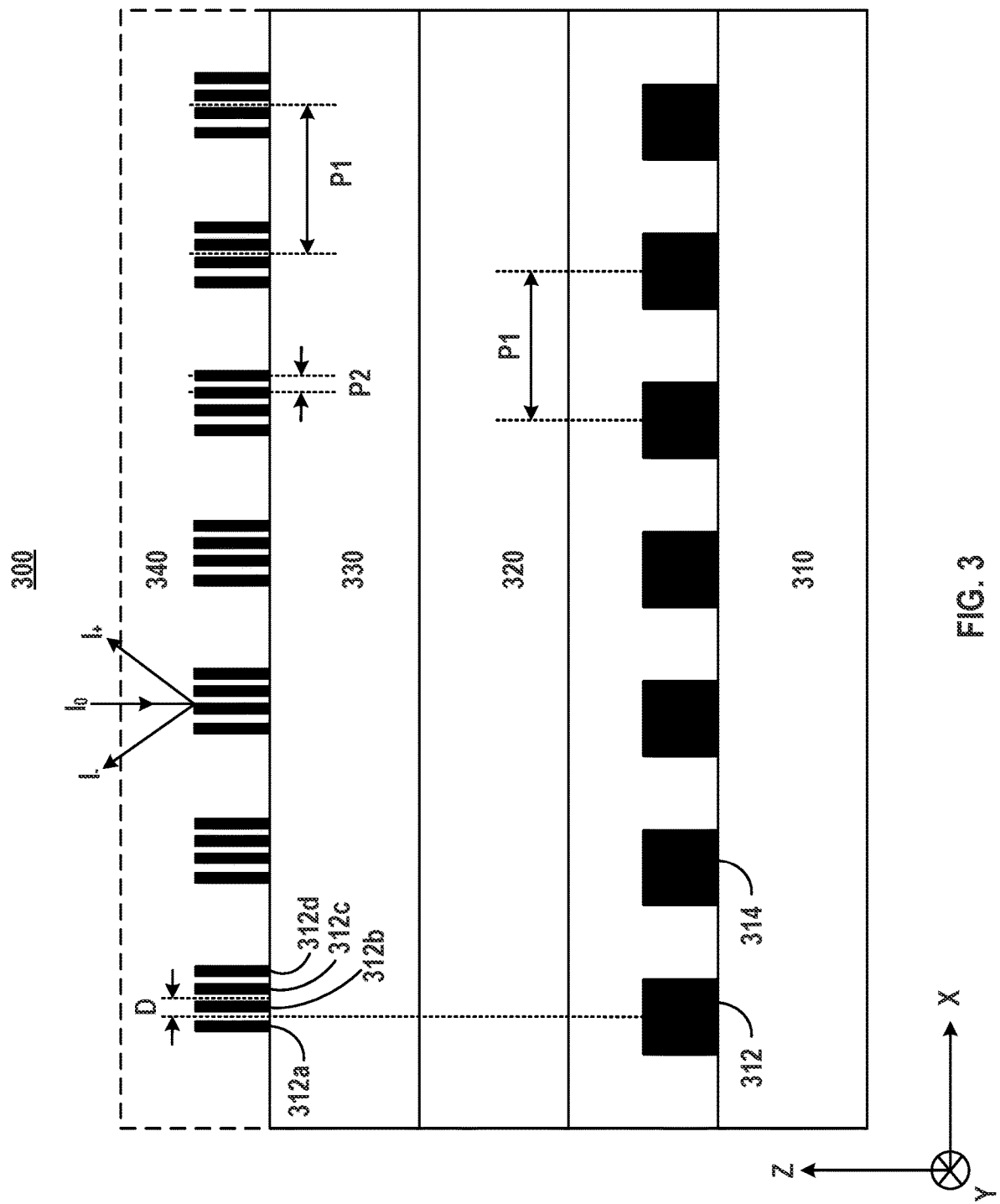
FIGS. 3 and 4 illustrate exemplary semiconductor devices having overlay markings, according to some embodiments of the present disclosure.
Figure 4:
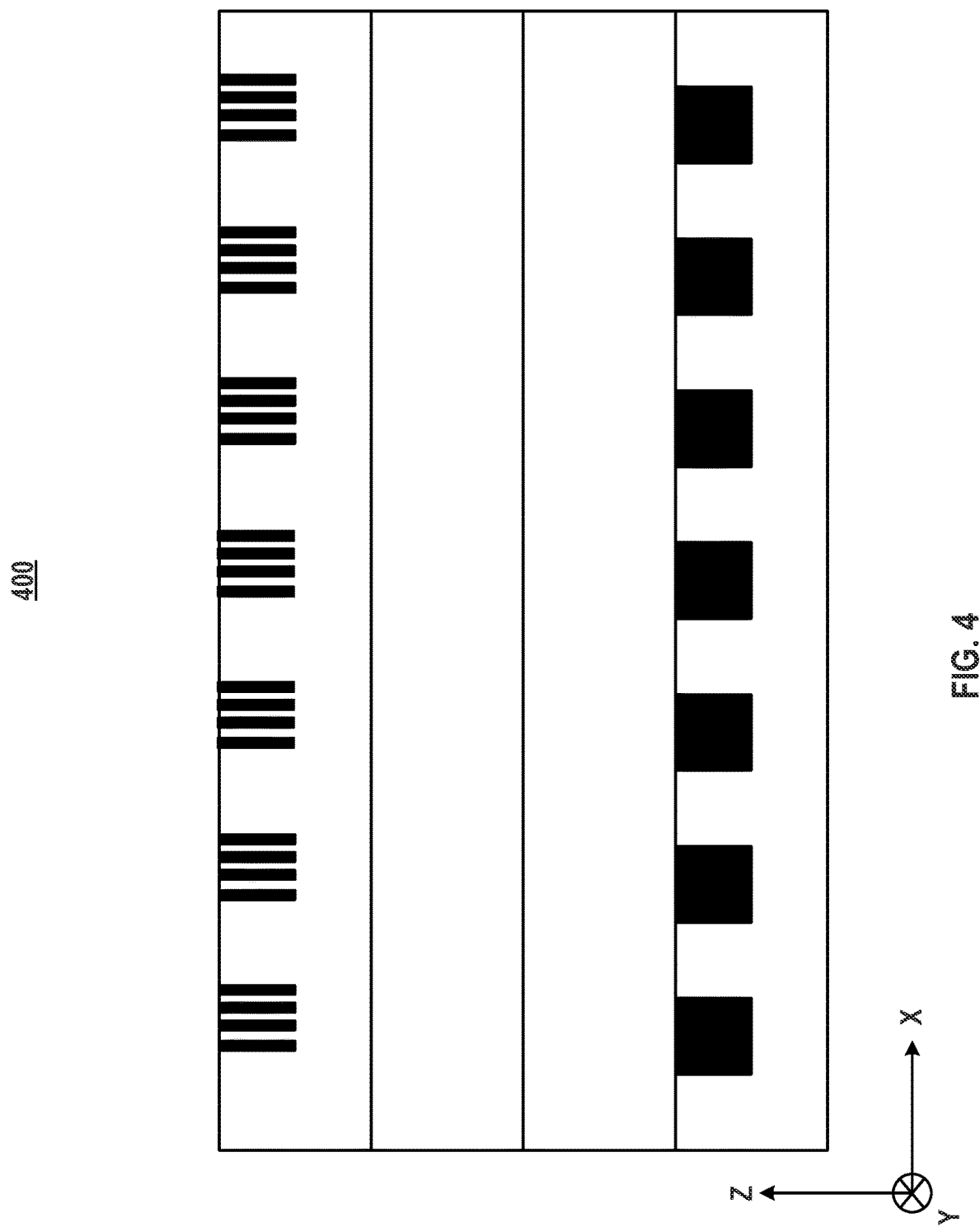

FIGS. 3 and 4 show section views of exemplary semiconductor devices having overlay markings, according to some embodiments of the present disclosure. FIG. 3 shows an example where positive grating structures, e.g., ridges, are used to form the overlay markings, while FIG. 4 shows an example where negative grating structures, e.g., grooves, are used to form the overlay markings.

Referring to FIG. 3, semiconductor device 300 may include multiple layers, such as 310, 320, 330, and 340. Layer 310 may be the reference layer, on which a grating structure having period P1 is provided. As shown in FIG. 3, the grating structure on layer 310 may include periodically arranged ridges, e.g., 312, 314, etc. Ridges 312 and 314 may correspond to structures 112a and 112b in FIG. 1, respectively. Layers 320 and 330 may be intermediate layers. Layer 340 may be the target layer, on which a finer grating structure is provided. The finer grating structure, which may be a grating cluster or at least a part thereof, is formed by a plurality of grating units each generally overlay a corresponding ridge on layer 310. The plurality of grating units are arranged periodically according to period P1. Each grating unit includes a plurality of smaller ridges (e.g., 312a, 312b, 312c, and 312d) forming a grating having period P2. For example, grating unit formed by ridges 312a-312d generally overlays the corresponding ridge 312.

In some embodiments, a grating cluster in the set of overlay markings on the target layer misaligns with a corresponding grating in the set of overlay markings on the reference layer by a predetermined offset. As shown in FIG. 3, this offset can be represented by an offset D measured between the geometrical center of a grating unit (e.g., the grating unit formed by 312a-312d) on layer 340 and the center of the corresponding ridge (e.g., 312) on layer 310. In some embodiments, a different offset value may be used to set the offset for the corresponding gratings in each quadrant. For example, referring to FIG. 1, the offset value for the first quadrant, corresponding to grating 122, with respect to its upper layer finer counterpart, may be set as +D along the Y direction. The offset value for the second quadrant, corresponding to grating 112, with respect to its upper layer finer counterpart, may be set as −D along the X direction (e.g., moving toward the −X direction for D). Similarly, the offset value for the third quadrant, corresponding to grating 124, with respect to its upper layer finer counterpart, may be set as −D along the Y direction (e.g., moving toward the −Y direction for D). The offset value for the fourth quadrant, corresponding to grating 114, with respect to its upper layer finer counterpart, may be set as D along the X direction.

FIG. 4 shows a semiconductor device 400 having the same arrangement of overlay markings on the reference and target layers as that of semiconductor device 300, except that the overlay markings used in semiconductor device 400 have a negative grating structure, e.g., using grooves instead of ridges. Accordingly, detailed explanation of the overlay marking arrangement in semiconductor device 400 is omitted.

Information of the overlay markings on the reference layer and/or the target layer can be obtained by imaging these layers using an imaging device, such as an optical imaging device. Information of the overlay markings may include position information of the overlay markings (e.g., the spatial position of each overlay marking), size information (e.g., the size/width of each overlay marking), offset information (e.g., offset values between corresponding overlay markings between reference and target layers), period information (e.g., P1/P2), layer information, etc.

In some embodiments, an optical proximity calibration may be performed to the target layer of the semiconductor device prior to obtaining the information of the overly markings. In some embodiments, the optical model and the photoresist model used during the optical proximity calibration process may be the same as the optical model and the photoresist model for the target layer. Performing optical proximity calibration may improve the accuracy of the imaging result, based on which the information of the overlay markings is obtained.

Embodiments of the present disclosure may obtain a plurality of diffraction parameters measured from corresponding overlay markings on the reference and target layers. For example, the diffraction parameters may include an intensity difference between two diffracted light signals resulting from illumination of corresponding overlay markings on the reference and target layers. Referring to FIG. 3, when the overlay markings are illuminated by an incident light signal with intensity $I_0$, the incident light signal will be diffracted by the grating structure and generate diffracted light signals. A DBO system can measure the intensity difference between the first order diffracted light signals $A=|I_+-I_-|$. The intensity difference A is a function of the overlay offset D at a fixed incident light wavelength. Therefore, when a different offset is used for each quadrant, different intensity difference values can be obtained. As discussed above, different offset values (e.g., D and –D) may be set in different quadrants. Accordingly, a plurality of intensity differences (e.g., denoted as $A_D$ and $A_{-D}$ respectively corresponding to the offset values D and –D) may be obtained resulting from illumination of the corresponding overlay markings in different quadrants that have different offsets.

Figure 5B:
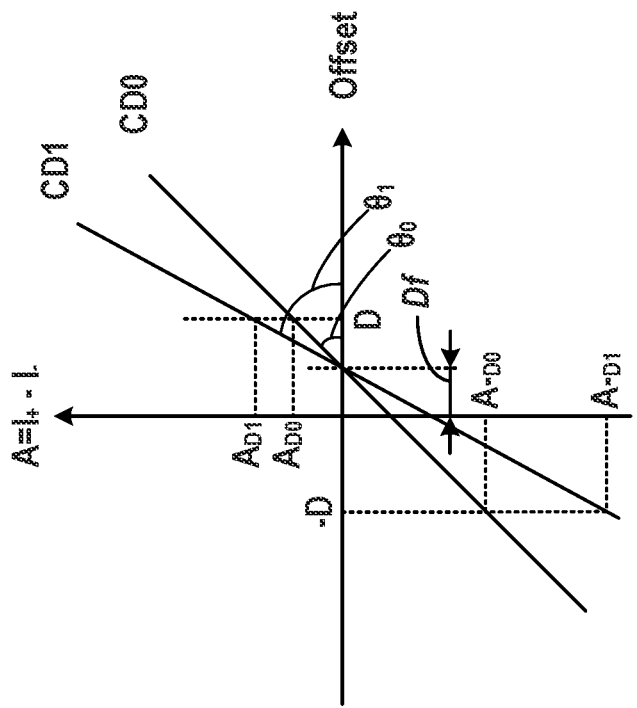
FIGS. 5A and 5B illustrate exemplary curves showing the relationship between diffraction parameters and overlay marking offsets, according to some embodiments of the present disclosure.
Figure 5A:
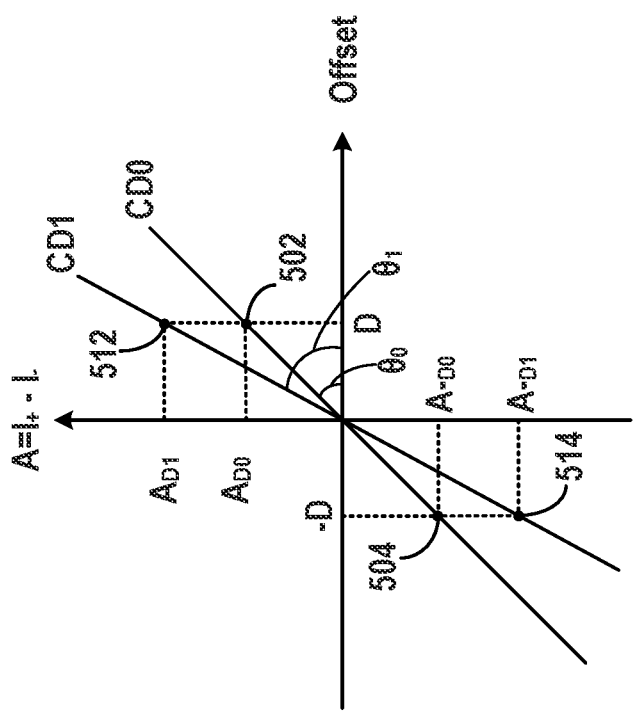

The relationship between intensity differences and offsets can be used to evaluate CDs. FIGS. 5A and 5B show exemplary curves indicating the relationship between intensity differences (the vertical axis A) and offsets (the horizontal axis Offset). FIG. 5A shows an ideal scenario in which no additional offset caused by the fabrication process is introduced, while FIG. 5B shows a scenario in which an additional offset Df is introduced by the fabrication process. Referring to FIG. 5A, when the offset is D (e.g., the first or fourth quadrant shown in FIGS. 1 and 2), an intensity difference $A_{D0}$ can be measured. Similarly, when the offset is –D (e.g., the second or third quadrant shown in FIGS. 1 and 2), another intensity difference $A_{-D0}$ can be measured. D and $A_{D0}$ correspond to point 502 shown in FIG. 5A, and –D and $A_{-D0}$ correspond to point 504 in FIG. 5A. Points 502 and 504 can define a line having a particular slope. It is observed that the slope of the line so defined relates to the CD on the target layer. When the CD changes, the slope changes accordingly. For example, assume that the line defined by points 502 and 504 indicates a first CD, denoted as CD0, when the CD changes to another value CD1, the same diffraction measurement yields intensity difference values $A_{D1}$ and $A_{D-1}$, which, together with the offset D, correspond to points 512 and 514 in FIG. 5A. The line defined by points 512 and 514, denoted as CD1, has a different slope than the line CD0 defined by points 502 and 504.

FIG. 5B shows that the additional offset introduced by the fabrication process does not change the relationship between the slope defined by the measurement points and the CD on the target layer. Referring to FIG. 5B, if the additional offset introduced by the fabrication process is Df, the lines CD0 and CD1 will shift to the right such that both lines cross the horizontal axis (Offset) at Df instead of the origin. However, the slopes of both lines CD0 and CD1 remain unchanged. The relationship between Df, D, and the measured intensity differences is governed by the following equation (1):

$$Df = D\frac{A_{D0} + A_{-D0}}{A_{D0} - A_{-D0}} = D\frac{A_{D1} + A_{-D1}}{A_{D1} - A_{-D1}}. \quad (1)$$

In addition, the relationship between CDs and the measured intensity differences is governed by the following equation (2):

$$\frac{CD1}{CD0} = \frac{\tan\theta_1}{\tan\theta_0} = \frac{A_{D1} - A_{-D1}}{A_{D0} - A_{-D0}}. \quad (2)$$

Embodiments of the present disclosure can calculate the offset introduced by the fabrication process based on the measured intensity differences and the corresponding offset(s) D according to equation (1). In addition, embodiments of the present disclosure can calculate the slope based on the measured intensity differences and corresponding offset(s) D according to equation (2). Because the slope indicates the CD on the target layer, embodiments of the present disclosure can determine the variation of the CDs based on the slop. In some embodiments, the absolute value of the slope may not be necessary. Instead, the relative value, e.g., with respect to a reference, of the slope may be used to determine the variation of the CDs. For example, a distribution of the relative changes of CDs on the target layer can be determined based on the slope values (either absolute or relative) calculated from the measured intensity differences across an extended area of the target layer. In this way, evaluation of the CD variations can be achieved using DBO metrology without resorting to the conventional CDSEM or OCD methods, significantly reducing the overall cost of performing quality control and assurance during the semiconductor fabrication process.

In some embodiments, the intensity difference can be measured using light signals having a single wavelength. In other embodiments, the intensity difference can be measured using light signals have different wavelengths. The relationships indicated by equations (1) and (2) remain unchanged under differing wavelengths. Embodiments of the present disclosure can reduce measurement errors by averaging the measurement results and/or calculation results under different wavelengths. For example, embodiments of the present disclosure can calculate fabrication offsets (e.g., Df) under different wavelengths, and average the calculated fabrication offsets to reduce measurement errors.

Figure 6:
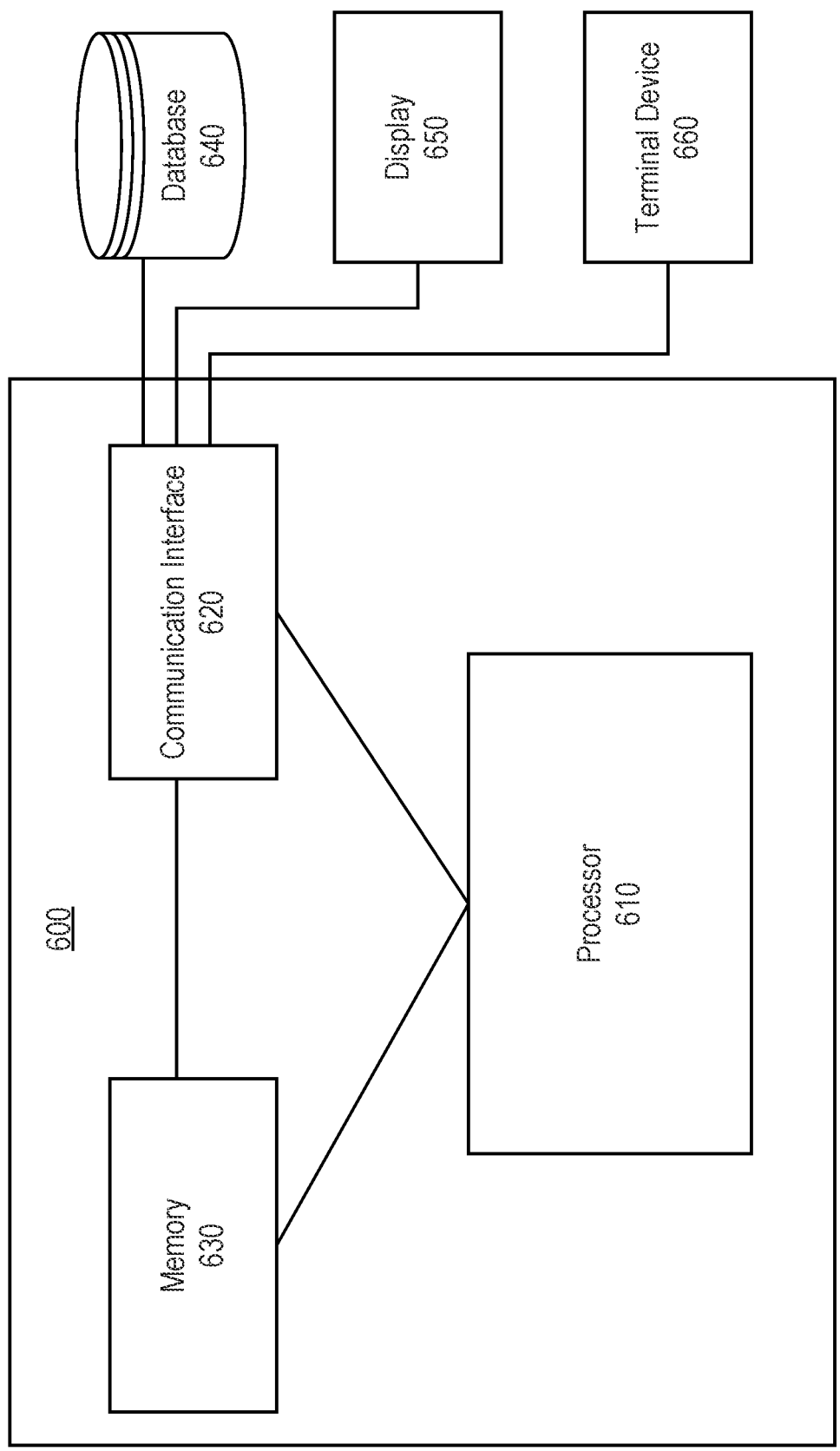
FIG. 6 illustrates a block diagram of an exemplary system for evaluating critical dimensions of a semiconductor device, according to some embodiments of the present disclosure.

FIG. 6 illustrates an exemplary system 600 for evaluating CDs of a semiconductor device, according to embodiments of the disclosure. Referring to FIG. 6, system 600 may include at least one processor 610, a communication interface 620, and a memory 630. Memory 630 may be configured to store one or more computer instructions that, when executed by processor 610, can cause processor 610 to perform various operations disclosed herein. Memory 630 may be any non-transitory type of mass storage, such as volatile or non-volatile, magnetic, semiconductor-based, tape-based, optical, removable, non-removable, or other type of storage device or tangible computer-readable medium including, but not limited to, a ROM, a flash memory, a dynamic RAM, and a static RAM.

Processor 610 may be configured to perform the operations in accordance with the instructions stored in memory 630. Processor 610 may include any appropriate type of general-purpose or special-purpose microprocessor, digital signal processor, or microcontroller. Processor 610 may be configured as a separate processor module dedicated to performing one or more specific operations. Alternatively, processor 610 may be configured as a shared processor module for performing other operations unrelated to the one or more specific operations disclosed herein.

Communication interface 620 may include any type of communication adaptor, such as an integrated services digital network (ISDN) card, cable modem, satellite modem, or a modem to provide a data communication connection. As another example, communication interface 620 may include a local area network (LAN) card to provide a data communication connection to a compatible LAN. Wireless links can also be implemented by communication interface 620. In such an implementation, communication interface 620 can send and receive electrical, electromagnetic or optical signals that carry digital data streams representing various types of information via a network. The network can typically include a cellular communication network, a Wireless Local Area Network (WLAN), a Wide Area Network (WAN), or the like. In some embodiments, communication interface 620 may also include input/output interfaces, such as display interface (e.g., HDMI, DVI, VGA, etc.), audio interface, keyboard interface, mouse interface, printer interface, touch screen interface, etc.

Communication interface 620 may be configured to exchange information between system 600 and one or more other systems/devices. For example, communication interface 620 may communicate with a database 640, which may store information about semiconductor device design and/or fabrication, such as mask information, wafer information, feature pattern information, or the like. In some embodiments, database 640 may store overlay marking information, layer information, offset information, diffraction parameters, critical dimension information, or other information related to the evaluation of CDs. In some embodiments, processor 610 may receive information stored in database 640 through communication interface 620.

In another example, a display 650 may be coupled to system 600 through communication interface 620. Display 650 may include a Liquid Crystal Display (LCD), a Light Emitting Diode Display (LED), a plasma display, or any other type of display, and provide a Graphical User Interface (GUI) presented on the display for user input and data depiction. The display may include a number of different types of materials, such as plastic or glass, and may be touch-sensitive to receive inputs from the user. For example, the display may include a touch-sensitive material that is substantially rigid, such as Gorilla Glass™, or substantially pliable, such as Willow Glass™. In some embodiments, information about semiconductor layers, overlay markings, offsets, diffraction parameters, critical dimensions, etc., may be displayed on display 650. In some embodiments, an alert may be triggered and shown on display 650 after one or more operations performed by processor 610 are completed.

In a further example, a terminal device 660 may be coupled to system 600 through communication interface 620. Terminal device 660 may include a desktop computer, a workstation, a laptop computer, a mobile phone, a tablet, a wearable device, or any other type of device configured to perform computational tasks. In some embodiments, a user may use terminal device 660 to control system 600, for example, to initiate, monitor, or terminate operations related to designing and analyzing overlay markings, processing diffraction parameters, and/or evaluating critical dimensions. In some embodiments, terminal device 660 may receive information about critical dimensions generated by system 600. In some embodiments, terminal device 660 may receive notification or alerts indicating the status of operations performed by processor 610. For example, a signal indicating a variation of the critical dimensions passes a validation process may be communicated to terminal device 660 through communication interface 620. In another example, a signal indicating a variation of the critical dimensions fails the validation process may be communicated to terminal device 660, and terminal device 660 may initiate remedy measures for feeding back to the fabrication process.

It is noted that one or more of database 640, display 650, and/or terminal device 660 may be part of system 600, and may be co-located with system 600 or located remotely with respect to system 600 and communicated with system 600 via a network or any suitable type of communicate link.

Figure 7:
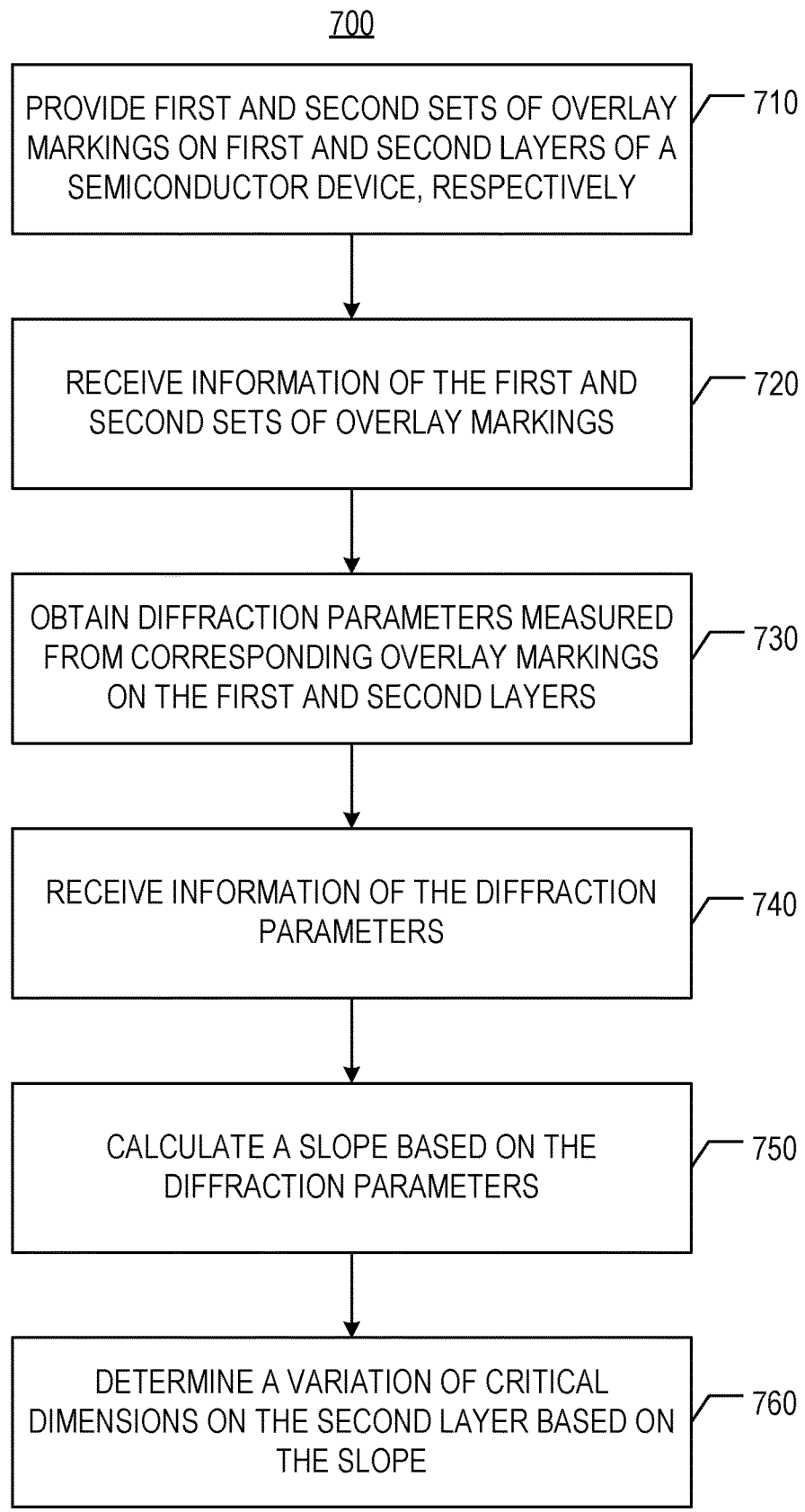
FIG. 7 is a flowchart of an exemplary method for evaluating critical dimensions of a semiconductor device, according to some embodiments of the present disclosure.

FIG. 7 illustrates a flowchart of an exemplary method 700 for evaluating CDs of a semiconductor device, according to some embodiments of the present disclosure. Referring to FIG. 7, method 700 may include a plurality of steps, at least some of which may be performed by processor 610. For example, instructions implementing method 700 may be stored in memory 630 and executed by processor 610. It is contemplated that any suitable step of method 700 can be performed by processor 610 alone or jointly by multiple processors. In the following, processor 610 is used as an example in describing the relevant steps of method 700. It is to be appreciated that some of the steps may be optional to perform the embodiments provided herein. Further, some of the steps may be performed simultaneously, or in a different order than shown in FIG. 7.

In step 710, method 700 may include providing first and second sets of overlay markings on first and second layers of a semiconductor device, respectively. For example, the first set of overlay markings may include the overlay markings shown in FIG. 1, and the second set of overlay markings may include the overlay markings shown in FIG. 2. In some embodiments, step 710 may include forming the first and second sets of overlay markings on the semiconductor device. In some embodiments, step 710 may include making available the configuration and/or design of the first and second sets of overlay markings for evaluating CDs.

In step 720, processor 610 may receive information of the first and second sets of overlay markings. For example, processor 610 may receive the information from database 640, terminal device 660, or other suitable sources through communication interface 620. In some embodiments, information of the first and second sets of overlay markings may be obtained by imaging the first and second layers of the semiconductor device using an imaging device, as described above. The imaging result may be analyzed and processed to extract the information of the first and second sets of overlay markings, including, for example, position information, size information, offset information, period information, layer information, etc. In some embodiments, prior to obtaining the information of the first and second sets of overlay markings, an optical proximity calibration may be performed to enhance the imaging accuracy.

In step 730, method 700 may include obtaining diffraction parameters measured from corresponding overlay markings on the first and second layers. For example, the diffraction parameters may include an intensity difference between two diffracted light signals resulting from illumination of corresponding overlay markings on the first and second layers, as described above in connection with FIGS. 3 and 4. In some embodiments, multiple intensity differences may be measured each resulting from illumination of the corresponding overlay markings that have a different offset, such as the different offsets set for different quadrants, as described above. The intensity difference can be measured by a DBO system, and the measurement result can be processed, analyzed, and/or stored. In some embodiments, the intensity difference may be measured using a light signal having a single wavelength. In other embodiments, the intensity difference may be measured using light signals having different wavelengths. Measurement results from different wavelengths can be averaged to reduce measurement errors.

In step 740, processor 610 may receive information of the diffraction parameters. For example, processor 610 may receive the information from a DBO system through communication interface 620. In another example, the information can be stored in database 640, which can be accessed by processor 610 through communication interface 620. In a further example, the information may be provided at terminal device 660, and processor 610 may connect to terminal device 660 through communication interface 620 to receive the information. In any case, information of the diffraction parameters, such as the intensity difference data, can be received by processor 610 for further processing.

In step 750, processor 610 may calculate a slope based on the diffraction parameters. For example, processor 610 may calculate the slope based on equation (2), as discussed above in connection with FIGS. 5A and 5B. The slope relates to a particular CD on the target layer. As discussed above, the slope may be in the form of an absolute value or a relative value. In either case, an indication of the CD can be determined based on measured diffraction parameters (e.g., intensity differences). In some embodiments, processor 610 may also calculate the fabrication offset (e.g., Df) based on equation (1). When multiple wavelengths are used to illuminate the overlay markings, processor 610 may calculate multiple fabrication offsets corresponding to the multiple wavelengths, and average the multiple fabrication offsets to reduce measurement errors.

In step 760, processor 610 may determine a variation of CDs on the second layer based on the slope. For example, processor 610 may analyze the slope distribution across an area on the target layer or even the entire wafer surface. Variation of the CDs can be determined based on the changes of the slopes, according to equation (2). In addition, processor 610 may determine other related parameters such as the offset value caused by the fabrication process (e.g., Df) according to equation (1). A verification process may follow to verify whether the CD variation and/or fabrication-based offset are within their respective tolerance. In this way, the critical dimensions on the target layer can be monitored and evaluated using DBO metrology. The evaluation result can be fed back to guide the fabrication process.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

According to one aspect of the present disclosure, a system for evaluating critical dimensions of a semiconductor device is provided. The system includes at least one processor and at least one memory storing instructions. The instructions, when executed by the at least one processor, cause the at least one processor to perform operations. The operations include receiving information of a first set of overlay markings on a first layer of the semiconductor device and information of a second set of overlay markings on a second layer of the semiconductor device. The first layer is lower than the second layer. The operations also include receiving information of a plurality of diffraction parameters measured from corresponding overlay markings on the first and second layers. The operations also include determining a variation of the critical dimensions on the second layer based on the plurality of diffraction parameters.

In some embodiments, the first set of overlay markings includes a plurality of diffraction gratings. Each of the plurality of diffraction gratings has a first period.

In some embodiments, the plurality of diffraction gratings include a first group of diffraction gratings oriented in a first direction and a second group of diffraction gratings oriented in a second direction perpendicular to the first direction.

In some embodiments, at least two diffraction gratings in the first group or the second group are diagonally disposed with respect to each other.

In some embodiments, the first period is in a range between 500 nanometers to 10 micrometers.

In some embodiments, the second set of overlay markings includes a plurality diffraction grating clusters. Each of the plurality of diffraction grating clusters has a plurality of diffraction grating units. The plurality of diffraction grating units in at least one of the plurality of diffraction grating clusters have the first period.

In some embodiments, at least one of the plurality of diffraction grating units includes a diffraction grating that has a second period that is smaller than the first period.

In some embodiments, the second period is substantially the same as a structural period of an anchor pattern on the second layer.

In some embodiments, the diffraction grating having the second period includes linear structures.

In some embodiments, the diffraction grating having the second period comprises non-linear structures.

In some embodiments, the second period is in a range between 1 nanometer to 500 nanometers.

In some embodiments, the diffraction grating having the second period is symmetrically arranged with respect to a geometrical center of the corresponding diffraction grating unit.

In some embodiments, the diffraction grating having the second period has a same orientation as the at least one of the plurality of diffraction grating units.

In some embodiments, the diffraction grating having the second period has an orientation perpendicular to the at least one of the plurality of diffraction grating units.

In some embodiments, at least one diffraction grating cluster in the second set of overlay markings misaligns with a corresponding diffraction grating in the first set of overlay markings by a predetermined offset.

In some embodiments, the information of the first and second sets of overlay markings are obtained by imaging the first and second layers of the semiconductor device using an imaging device.

In some embodiments, an optical proximity calibration is performed to the second layer of the semiconductor device prior to obtaining the information of the first and second sets of overly markings.

In some embodiments, the first and second sets of overlay markings include at least one of a positive grating structure or a negative grating structure.

In some embodiments, the plurality of diffraction parameters include at least one intensity difference between two diffracted light signals resulting from illumination of corresponding overlay markings on the first and second layers.

In some embodiments, the at least one intensity difference includes a plurality of intensity differences each resulting from illumination of the corresponding overlay markings that have a different offset.

In some embodiments, the operations further include calculating a slope based on the plurality of intensity differences and corresponding offsets.

In some embodiments, determining the variation of the critical dimensions on the second layer includes determining the variation based on the slope.

In some embodiments, the at least one intensity difference is measured using a light signal having a first wavelength.

In some embodiments, the at least one intensity difference is measured using light signals having different wavelengths.

In some embodiments, the operations further include calculating fabrication offsets corresponding to the different wavelengths and reducing measurement errors by averaging the calculated fabrication offsets.

According to another aspect of the present disclosure, a method for evaluating critical dimensions of a semiconductor device is provided. The method includes providing a first set of overlay markings on a first layer of the semiconductor device and a second set of overlay markings on a second layer of the semiconductor device. The first layer is lower than the second layer. The method also includes obtaining a plurality of diffraction parameters measured from corresponding overlay markings on the first and second layers. The method further includes determining a variation of the critical dimensions on the second layer based on the plurality of diffraction parameters.

In some embodiments, the first set of overlay markings includes a plurality of diffraction gratings. Each of the plurality of diffraction gratings has a first period.

In some embodiments, the plurality of diffraction gratings include a first group of diffraction gratings oriented in a first direction and a second group of diffraction gratings oriented in a second direction perpendicular to the first direction.

In some embodiments, at least two diffraction gratings in the first group or the second group are diagonally disposed with respect to each other.

In some embodiments, the first period is in a range between 500 nanometers to 10 micrometers.

In some embodiments, the second set of overlay markings includes a plurality of diffraction grating clusters. Each of the plurality of diffraction grating clusters has a plurality of diffraction grating units. The plurality of diffraction grating units in at least one of the plurality of diffraction grating clusters have the first period.

In some embodiments, at least one of the plurality of diffraction grating units includes a diffraction grating that has a second period smaller than the first period.

In some embodiments, the second period is substantially the same as a structural period of an anchor pattern on the second layer.

In some embodiments, the diffraction grating having the second period includes linear structures.

In some embodiments, the diffraction grating having the second period includes non-linear structures.

In some embodiments, the second period is in a range between 1 nanometer to 500 nanometers.

In some embodiments, the diffraction grating having the second period is symmetrically arranged with respect to a geometrical center of the corresponding diffraction grating unit.

In some embodiments, the diffraction grating having the second period has a same orientation as the at least one of the plurality of diffraction grating units.

In some embodiments, the diffraction grating having the second period has an orientation perpendicular to the at least one of the plurality of diffraction grating units.

In some embodiments, at least one diffraction grating cluster in the second set of overlay markings misaligns with a corresponding diffraction grating in the first set of overlay markings by a predetermined offset.

In some embodiments, the method further includes obtaining information of the first and second sets of overlay markings by imaging the first and second layers of the semiconductor device using an imaging device.

In some embodiments, the method further includes performing an optical proximity calibration to the second layer of the semiconductor device prior to obtaining the information of the first and second sets of overly markings.

In some embodiments, the first and second sets of overlay markings include at least one of a positive grating structure or a negative grating structure.

In some embodiments, the plurality of diffraction parameters include at least one intensity difference between two diffracted light signals resulting from illumination of corresponding overlay markings on the first and second layers.

In some embodiments, the at least one intensity difference includes a plurality of intensity differences each resulting from illumination of the corresponding overlay markings that have a different offset.

In some embodiments, the method further includes calculating a slope based on the plurality of intensity differences and corresponding offsets.

In some embodiments, determining the variation of the critical dimensions on the second layer includes determining the variation based on the slope.

In some embodiments, the method further includes measuring the at least one intensity difference using a light signal having a first wavelength.

In some embodiments, the method further includes measuring the at least one intensity difference using light signals having different wavelengths.

In some embodiments, the method further includes calculating fabrication offsets corresponding to the different wavelengths and reducing measurement errors by averaging the calculated fabrication offsets.

According to a further aspect of the present disclosure, a semiconductor device is provided. The semiconductor device includes a first layer including a first set of overlay markings and a second layer including a second set of overlay markings. The second layer is higher than the first layer. The first set of overlay markings includes a plurality of diffraction gratings. Each of the plurality of diffraction gratings has a first period. The second set of overlay markings includes a plurality diffraction grating clusters.

Each of the plurality of diffraction grating clusters has a plurality of diffraction grating units. The plurality of diffraction grating units in at least one of the plurality of diffraction grating clusters have the first period and at least one of the plurality of diffraction grating units includes a diffraction grating having a second period that is smaller than the first period.

In some embodiments, the plurality of diffraction gratings includes a first group of diffraction gratings oriented in a first direction and a second group of diffraction gratings oriented in a second direction perpendicular to the first direction.

In some embodiments, at least two diffraction gratings in the first group or the second group are diagonally disposed with respect to each other.

In some embodiments, the first period is in a range between 500 nanometers to 10 micrometers.

In some embodiments, the second period is substantially the same as a structural period of an anchor pattern on the second layer.

In some embodiments, the diffraction grating having the second period includes linear structures.

In some embodiments, the diffraction grating having the second period includes non-linear structures.

In some embodiments, the second period is in a range between 1 nanometer to 500 nanometers.

In some embodiments, the diffraction grating having the second period is symmetrically arranged with respect to a geometrical center of the corresponding diffraction grating unit.

In some embodiments, the diffraction grating having the second period has a same orientation as the at least one of the plurality of diffraction grating units.

In some embodiments, the diffraction grating having the second period has an orientation perpendicular to the at least one of the plurality of diffraction grating units.

In some embodiments, at least one diffraction grating cluster in the second set of overlay markings misaligns with a corresponding diffraction grating in the first set of overlay markings by a predetermined offset.

In some embodiments, the first and second sets of overlay markings include at least one of a positive grating structure or a negative grating structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device, comprising:
   a first layer comprising a first set of overlay markings; and
   a second layer comprising a second set of overlay markings, the second layer being higher than the first layer, wherein:
   the first set of overlay markings comprises a plurality of diffraction gratings, each of the plurality of diffraction gratings having a first period;
   the second set of overlay markings comprises a plurality of diffraction grating clusters, each of the plurality of diffraction grating clusters having a plurality of diffraction grating units, wherein the plurality of diffraction grating units in at least one of the plurality of diffraction grating clusters have the first period and at least one of the plurality of diffraction grating units comprises a plurality of diffraction gratings having a second period that is smaller than the first period; and
   a first longitudinal-axis associated with a first diffraction grating of a first diffraction grating unit is oriented parallel to a second longitudinal-axis associated with the first diffraction grating unit and a third longitudinal-axis associated with a second diffraction grating of a second diffraction grating unit is oriented perpendicular to a fourth longitudinal-axis associated with the second diffraction grating unit.

2. The semiconductor device of claim 1, wherein the plurality of diffraction gratings comprise a first group of diffraction gratings oriented in a first direction and a second group of diffraction gratings oriented in a second direction perpendicular to the first direction.

3. The semiconductor device of claim 2, wherein at least two diffraction gratings in the first group or the second group are diagonally disposed with respect to each other.

4. The semiconductor device of claim 1, wherein the first period is in a range between 500 nanometers to 10 micrometers.

5. The semiconductor device of claim 1, wherein the second period is substantially the same as a structural period of an anchor pattern on the second layer.

6. The semiconductor device of claim 1, wherein the plurality of diffraction gratings having the second period comprise linear structures.

7. The semiconductor device of claim 1, wherein the plurality of diffraction gratings having the second period comprises comprise non-linear structures.

8. The semiconductor device of claim 1, wherein the second period is in a range between 1 nanometer to 500 nanometers.

9. The semiconductor device of claim 1, wherein the plurality of diffraction gratings having the second period are symmetrically arranged with respect to a geometrical center of a corresponding diffraction grating unit.

10. The semiconductor device of claim 1, wherein the plurality of diffraction gratings having the second period have a same orientation as the at least one of the plurality of diffraction grating units.

11. The semiconductor device of claim 1, wherein the plurality of diffraction gratings having the second period have an orientation perpendicular to the at least one of the plurality of diffraction grating units.

12. The semiconductor device of claim 1, wherein at least one diffraction grating cluster in the second set of overlay markings misaligns with a corresponding diffraction grating in the first set of overlay markings by a predetermined offset.

13. The semiconductor device of claim 1, wherein the first set of overlay markings and second set of overlay markings comprise at least one of a positive grating structure or a negative grating structure.

* * * * *